United States Patent
Sugawara

(10) Patent No.: US 8,055,958 B2
(45) Date of Patent: Nov. 8, 2011

(54) REPLACEMENT DATA STORAGE CIRCUIT STORING ADDRESS OF DEFECTIVE MEMORY CELL

(75) Inventor: Hiroshi Sugawara, Yokohama (JP)

(73) Assignee: Samsung Electronics Co., Ltd., Suwon (KR)

( * ) Notice: Subject to any disclaimer, the term of this patent is extended or adjusted under 35 U.S.C. 154(b) by 76 days.

(21) Appl. No.: 12/630,094

(22) Filed: Dec. 3, 2009

(65) Prior Publication Data

US 2010/0153775 A1    Jun. 17, 2010

(30) Foreign Application Priority Data

Dec. 11, 2008 (JP) ................................ 2008-315841
Aug. 27, 2009 (KR) ................................ 2009-79995

(51) Int. Cl.
*G11C 29/00* (2006.01)
(52) U.S. Cl. ........................................ 714/710; 714/723
(58) Field of Classification Search .................. 714/710, 714/711, 718–723; 365/200–201
See application file for complete search history.

(56) References Cited

U.S. PATENT DOCUMENTS

| | | | | |
|---|---|---|---|---|
| 4,164,031 A * | 8/1979 | Lou et al. | ............. | 365/233.1 |
| 4,747,080 A * | 5/1988 | Yamada | .................. | 365/200 |
| 5,111,434 A * | 5/1992 | Cho | ......................... | 365/207 |
| 5,347,484 A * | 9/1994 | Kwong et al. | ............. | 365/49.16 |
| 5,400,342 A * | 3/1995 | Matsumura et al. | .......... | 714/719 |
| 5,801,983 A * | 9/1998 | Saeki | ............................ | 365/149 |
| 5,831,988 A * | 11/1998 | Fagerness | ..................... | 714/719 |
| 6,198,659 B1 * | 3/2001 | Hirano | .................... | 365/185.09 |
| 6,529,420 B2 * | 3/2003 | Lee et al. | ................. | 365/189.07 |
| 6,925,000 B2 * | 8/2005 | Sussner | ......................... | 365/158 |
| 7,269,765 B1 * | 9/2007 | Charlton et al. | .............. | 714/710 |
| 7,382,664 B2 * | 6/2008 | Le Phan | .................. | 365/189.04 |
| 7,468,901 B2 * | 12/2008 | Kameshiro et al. | .......... | 365/149 |
| 7,590,007 B2 * | 9/2009 | Futatsuyama | ............ | 365/185.22 |
| 2003/0065973 A1 * | 4/2003 | Vollrath et al. | .................... | 714/7 |
| 2007/0115745 A1 * | 5/2007 | Byun et al. | ................ | 365/225.7 |

FOREIGN PATENT DOCUMENTS

JP      11-238393      8/1999

* cited by examiner

*Primary Examiner* — Jeffrey A Gaffin
*Assistant Examiner* — Steve Nguyen
(74) *Attorney, Agent, or Firm* — Stanzione & Kim, LLP

(57) ABSTRACT

A replacement data storage circuit stores an address of a defective memory cell. The replacement data storage circuit includes a plurality of word lines, a plurality of bit lines, and a plurality of replacement data memory cells. The replacement data memory cells are connected to the word lines and the bit lines to store an address of a defective memory cell. Each of the word lines is connected to a plurality of replacement data memory cells and each of the bit lines is connected to one replacement data memory cell.

18 Claims, 11 Drawing Sheets

REPLACEMENT DATA STORAGE CIRCUIT STORING ADDRESS OF DEFECTIVE MEMORY CELL

CROSS-REFERENCE TO RELATED APPLICATIONS

This U.S. non-provisional patent application claims priority under 35 U.S.C. §119 of Japanese Patent Application No. 2008-315841, filed on Dec. 11, 2008, and Korean Patent Application No. 10-2009-79995, filed on Aug. 27, 2009, the entire contents of which are hereby incorporated by reference.

BACKGROUND

1. Field of the Invention

The present disclosure relates to replacement data storage circuits, and more particularly, to replacement data storage circuits to store an address of a defective memory cell.

2. Description of the Related Art

For example, as disclosed in Japanese Laid-Open Patent Publication No. 11-238393, a nonvolatile memory device includes a redundancy circuit to replace a defective memory cell with a defect-free memory cell. The redundancy circuit stores replacement data (i.e., information about which memory cell is to be replaced) in a replacement data memory cell array. The redundancy circuit compares replacement data, which is read from the replacement data memory cell array, with a selected address, and performs a replacement operation on an address including a defective memory cell. Thus, the redundancy circuit needs a replacement data storage circuit including the replacement data memory cell array.

FIG. 5 is a diagram illustrating a typical replacement data storage circuit.

Referring to FIG. 5, a typical replacement data storage circuit includes a word line WL, a bit line BL, a replacement data memory cell array 11, a word line driver 12, a gate circuit 13, a sense amplifier 14, a latch circuit 15, and a control circuit 16. The replacement data memory cell array 11 includes a plurality of replacement data memory cells MC.

FIG. 6 is a timing diagram illustrating an operation of the typical replacement data storage circuit of FIG. 5.

Referring to FIG. 6, the typical replacement data storage circuit drives the word line WL when supplied with a power supply voltage VCC. Also, the typical replacement data storage circuit controls the gate circuit 13 when supplied with the power supply voltage VCC. That is, when supplied with the power supply voltage VCC, the typical replacement data storage circuit reads replacement data stored in the replacement data memory cell array 11. The read replacement data are transferred through the sensor amplifier 14 to the latch circuit 15.

However, when the power supply voltage VCC is supplied to the typical replacement data storage circuit, all the replacement data are transferred to the latch circuit. Thus, the amount of replacement data storable in the typical replacement data storage circuit may be restricted by the layout of a replacement data read circuit. Also, the typical replacement data storage circuit has low replacement efficiency.

SUMMARY

Embodiments of the present general inventive concept provide replacement data storage circuits that can improve a defect relief rate of a nonvolatile memory device by storing more replacement data.

Additional aspects and utilities of the present general inventive concept will be set forth in part in the description which follows and, in part, will be obvious from the description, or may be learned by practice of the general inventive concept.

Features and/or utilities of the present general inventive concept may be realized by replacement data storage circuits to store an address of a defective memory cell. The replacement data storage circuits may include a plurality of word lines, a plurality of bit lines, and a plurality of replacement data memory cells connected to the word lines and the bit lines to store an address of a defective memory cell. Each of the word lines may be connected to a plurality of replacement data memory cells and each of the bit lines may be connected to one replacement data memory cell.

The replacement data memory cells may be arranged diagonally at the intersections of the word lines and the bit lines.

The diagonal arrangement of the replacement data memory cells may be repeated.

The replacement data storage circuits may further include first and second word line drivers configured to drive the word lines. The first word driver may be driven in a read operation of a nonvolatile memory device and the second word line driver may be driven in a write or erase operation of the nonvolatile memory device.

The first word line driver and the second word line driver may be driven simultaneously.

Features and/or utilities of the present general inventive concept may also be realized by a replacement data storage circuit including a plurality of banks of memory cells, each bank including a plurality of word lines and a plurality of bit lines. Each memory cell of each separate bank may be connected to a separate word line and a separate bit line.

A first memory cell of each bank may be connected to a same first word line of the plurality of word lines, a respective subsequent memory cell of each bank may be connected to a same respective subsequent word line, and each memory cell may be connected to a separate bit line.

The replacement data storage circuit may also include at least one gate circuit to read data from and write data to each memory cell.

The replacement data storage circuit may also include at least first and second gate circuits to simultaneously read data from and write data to separate memory cells.

The replacement data storage circuit may also include a word line driver to drive a word line to access corresponding memory cells, a sense amplifier to amplify an output of a bit line of an accessed memory cell, and a control circuit to control operation of the line driver, the gate circuit, and the sense amplifier to read from and write to a memory cell.

The memory cells of each bank may be arranged diagonally with respect to each other memory cell in the bank.

The memory cells of each bank may be arranged in only one diagonal line.

The replacement data storage circuit may not include a latch circuit to latch data read from or written to each memory cell.

Each memory cell may include a transistor having a gate connected to a word line of the plurality of word lines, a source connected to a common source line, and a drain connected to a bit line of the plurality of bit lines.

Features and/or utilities of the present general inventive concept may also be realized by a non-volatile memory device including a memory unit and a replacement data storage circuit. The memory unit may include a memory cell array, a redundant cell array, and a data input/output unit to read data to and write data from the memory cell array and the redundant cell array, respectively. The replacement data storage circuit may receive an address corresponding to at least one memory cell of the memory cell array and output a control signal to direct the data input/output unit to read data to and write data from one of the memory cell array and the redundant cell array, respectively.

The non-volatile memory device may also include an input/output coding circuit to receive data from the replacement data storage circuit corresponding to the received address and a multiplexer to receive data from the input/output coding circuit corresponding to the data from the replacement data storage circuit, and to direct the data input/output unit to read data to and write data from one of the memory cell array and the redundant cell array, respectively, based on the data from the input/output coding circuit.

The memory unit may also include a decoder to receive the address corresponding to at least one memory cell of the memory cell array.

Features and/or utilities of the present general inventive concept may also be realized by a memory system including a non-volatile memory device and a controller to control operation of the non-volatile memory device.

Features and/or utilities of the present general inventive concept may also be realized by a computing device including a memory system, RAM memory to store data including data from the memory system, a user interface to initiate operations to access at least one of the memory system and the RAM, a CPU to control operation of the computing device including access to the memory system and RAM and the operation of the user interface, and a power supply.

BRIEF DESCRIPTION OF THE DRAWINGS

The accompanying drawings are included to provide a further understanding of the present general inventive concept, and are incorporated in and constitute a part of this specification. The drawings illustrate exemplary embodiments of the present general inventive concept and, together with the description, serve to explain principles of the present general inventive concept. In the drawings.

DETAILED DESCRIPTION OF THE EMBODIMENTS

Figure 1:
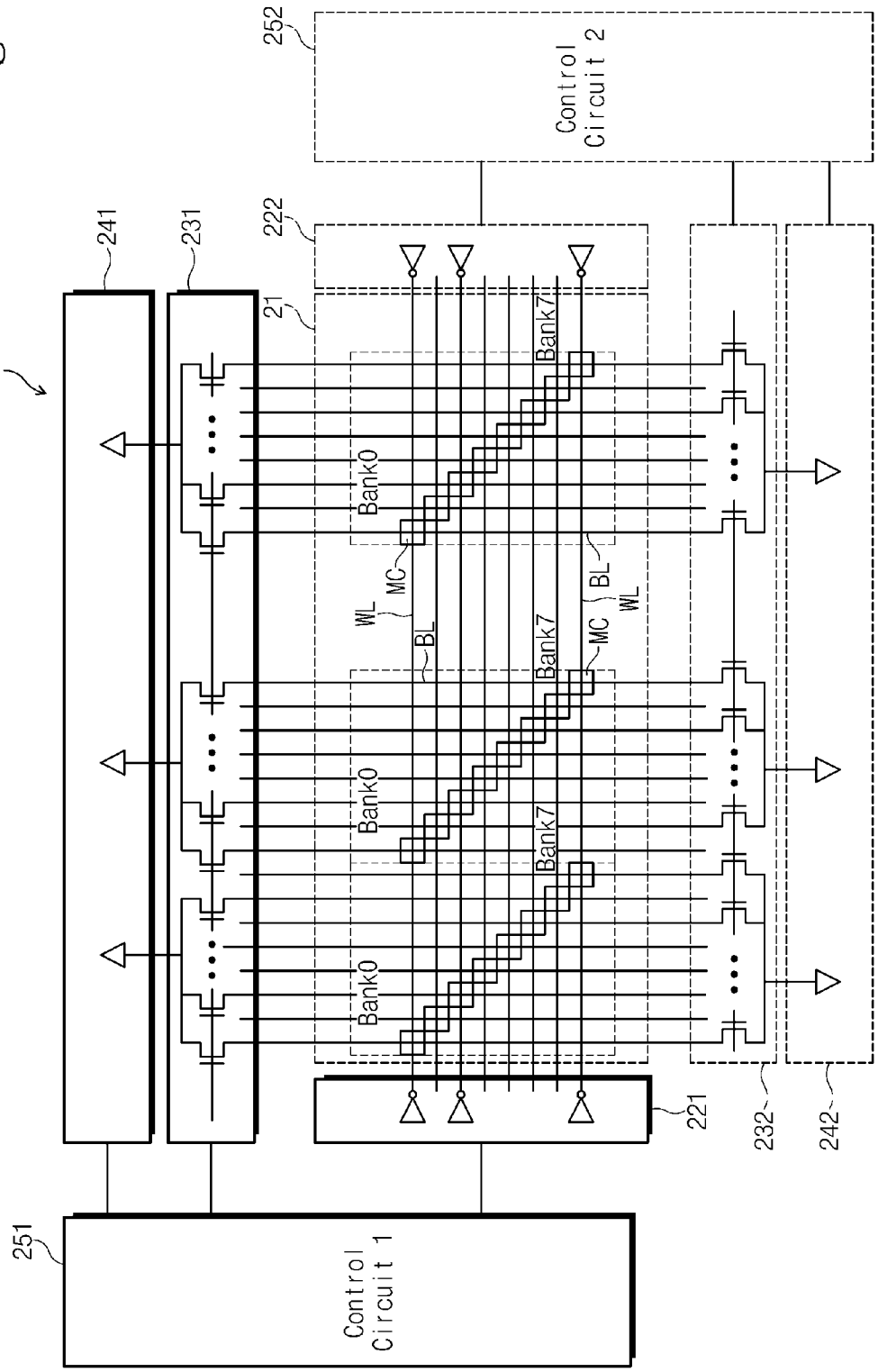
FIG. 1 is a circuit diagram of a replacement data storage circuit according to an exemplary embodiment of the present general inventive concept.

Preferred embodiments of the present general inventive concept will be described below in more detail with reference to the accompanying drawings. The present general inventive concept may, however, be embodied in different forms and should not be construed as limited to the embodiments set forth herein. Rather, these embodiments are provided so that this disclosure will be thorough and complete, and will fully convey the scope of the present general inventive concept to those skilled in the art. Like reference numerals refer to the like elements throughout.

Figure 2:
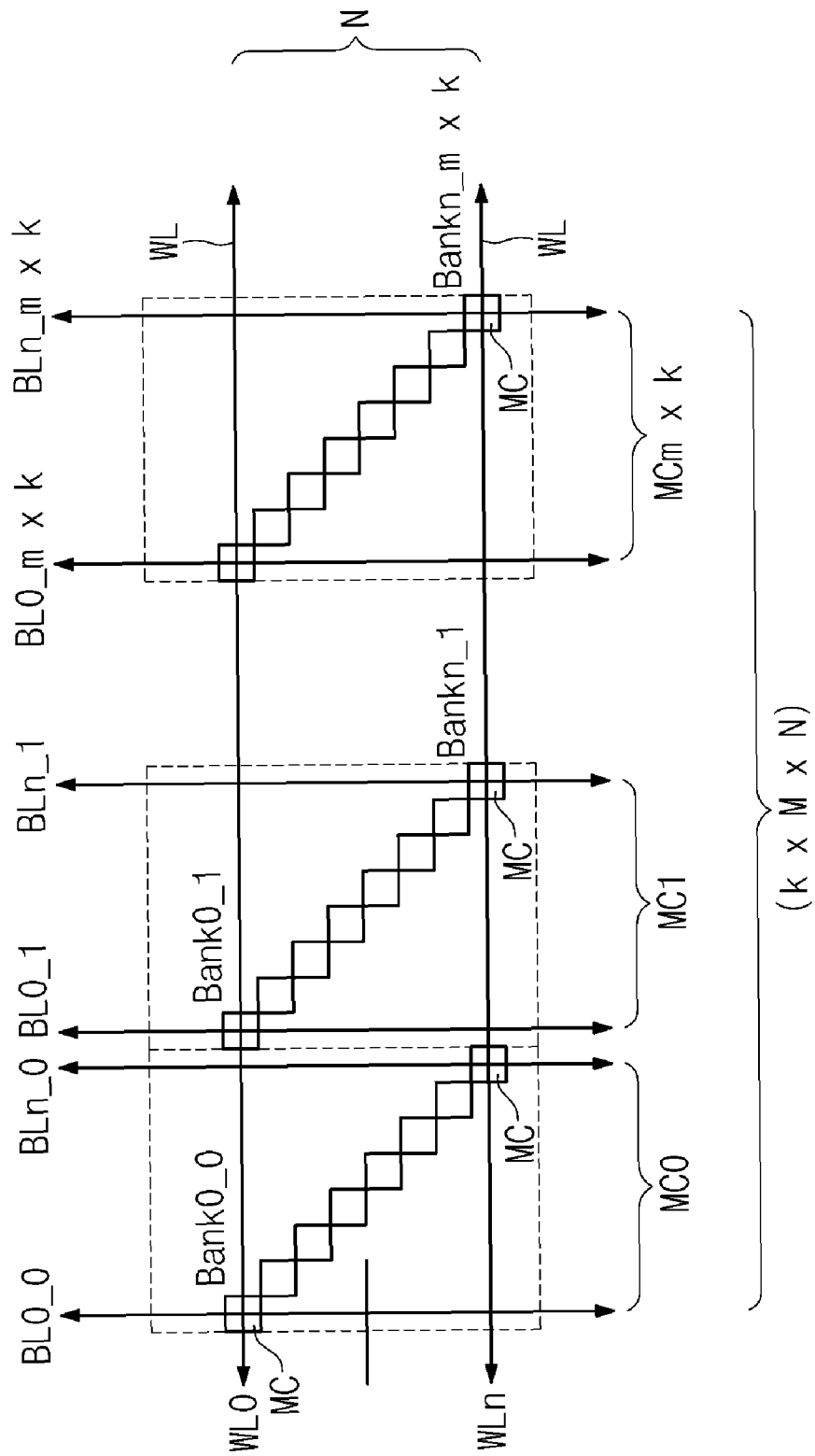
FIG. 2 is a circuit diagram of a replacement data memory cell array of the replacement data storage circuit of FIG. 1.
Figure 3:
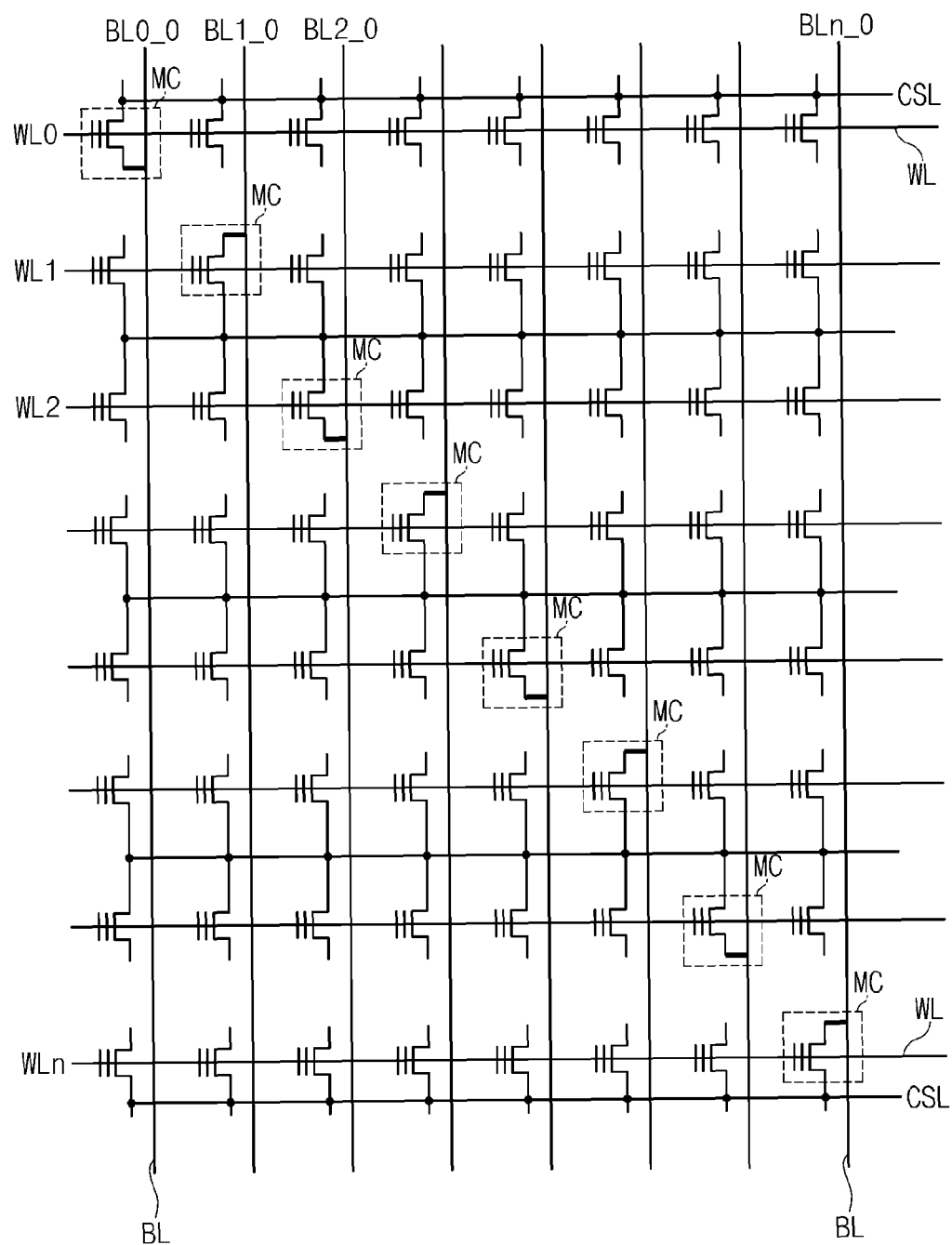
FIG. 3 is a detailed circuit diagram of the replacement data memory cell array of FIG. 2.

FIG. 1 is a circuit diagram of a replacement data storage circuit 200 according to an exemplary embodiment of the present general inventive concept. FIG. 2 is a circuit diagram of a replacement data memory cell array of the replacement data storage circuit of FIG. 1. FIG. 3 is a detailed circuit diagram of the replacement data memory cell array of FIG. 2. An array 21 of FIGS. 1 to 3 is a replacement data memory cell array 21. It is assumed that a nonvolatile memory device includes N banks, each bank includes M replaceable systems, and each system needs K-bit information as replacement data.

In this case, referring to FIG. 2, the replacement data memory cell array 21 includes N word lines WL, K×M×N bit lines BL, and K×M×N replacement data memory cells MC. Each word line WL corresponds to each bank of a nonvolatile memory device. The bit lines BL output replacement data and intersect the word lines WL. The replacement data memory cells MC store replacement data and are connected to the word lines WL.

The replacement data memory cells MC of K×M bits are disposed (arranged) at each word line WL. The replacement data memory cells MC of K×M bits connected to each word line WL store replacement data of all the systems of one bank. The replacement data memory cells MC may output replacement data to every word line WL (bank) discriminately. The replacement data memory cells MC are disposed diagonally at the intersections of the bit lines BL and the word lines WL, by changing the bit lines BL for every word line WL. Referring to FIG. 2, K×M replacement data memory cells MC are disposed at each word line WL, to which the present general inventive concept is not limited. As an example, if the replacement data memory cell MC is a single-level cell (SLC), K×M replacement data memory cells MC are disposed at each word line WL. As another example, if the replacement data memory cell MC is a multi-level cell (MLC), less than K×M replacement data memory cells MC are disposed at each word line WL.

Referring to FIG. 3, the replacement data memory cell MC connected to the word line WL0 is located at the intersection of the word line WL0 and the bit line BL0_0. The replacement data memory cell MC connected to the word line WL1 is located at the intersection of the word line WL1 and the bit line BL1_0. The replacement data memory cell MC connected to the word line WL2 is located at the intersection of the word line WL2 and the bit line BL2_0. Likewise, the replacement data memory cell MC connected to the word line WLn is located at the intersection of the word line WLn and the bit line BLn_0. Also, the replacement data memory cells MC of a plurality of bits are connected to each word line WL.

Thus, referring to FIGS. 1 and 2, the diagonal arrangement of the replacement data memory cell MC at the intersections of the bit lines BL and the word lines WL is repeated on a bit unit basis. For example, referring to FIG. 2, in the case of MC0, the replacement data memory cells MC are disposed diagonally in the first bit unit. In the case of MC1, the replacement data memory cells MC are disposed diagonally in the second bit unit. In the case of MCm×k, the replacement data memory cells MC are disposed diagonally in the (M×K)th bit (last bit) unit.

Referring to FIG. 3, a nonvolatile memory cell is used as a replacement data memory cell MC. Nonvolatile memory cells are disposed at all the interconnections of the word lines WL and the bit lines BL. However, the drain of a nonvolatile memory cell, which is not used as a replacement memory cell MC, is separate from the word line. Thus, such a non volatile memory cell is an off sell. The gate, source and drain of a nonvolatile memory cell, which is used as a replacement memory cell MC, are connected respectively to a word line WL, a common source line CSL, and a bit line BL. FIG. 3 illustrates that a NAND flash memory is used as a replacement data memory cell MC. However, the present general inventive concept is not limited thereto. For example, a nonvolatile memory such as a phase-change random access memory (PRAM), a magnetoresistive random access memory (MRAM), a resistive random access memory (RRAM), or a ferroelectric random access memory (FRAM) may be used as a replacement data memory cell MC. Also, a nonvolatile memory cell, which is not used as a replacement data memory cell MC, may not be generated in the fabrication process.

During a write/erase operation for a specific bank, the nonvolatile memory device may perform a read operation for another bank. Referring to FIG. 1, the replacement data storage circuit includes two pairs of word line drivers, gate circuits, sense amplifiers, and control circuits. This is for the case where a write/erase operation and a read operation are simultaneously performed in the nonvolatile memory device. This is to simultaneously read replacement data about a bank undergoing a write/erase operation and replacement data about a bank undergoing a read operation.

Referring to FIG. 1, a first word line driver 221, a first gate circuit 231, a first sense amplifier 241, and a first control circuit 251 are used to read replacement data in a read operation of the nonvolatile memory device.

The first word line driver 221 is connected to a word line WL to drive the word line. For example, the first word line driver 221 is disposed at one side (the left side in FIG. 1) of the replacement data memory cell array 21 and is connected to the word lines WL.

The first gate circuit 231 and the first sense amplifier 241 are configured to read replacement data outputted to the bit line. For example, the first gate circuit 231 and the first sense amplifier 241 are disposed at one side (the top side in FIG. 1) of the replacement data memory cell array 21 and are connected to the bit lines BL. The first gate circuit 231 may include a plurality of transistors, each having a source connected to a bit line BL, a drain connected to the first sense amplifier circuit 241, and a gate connected to a control signal. In FIG. 1, the plurality of intermediate transistors corresponding to each bank of memory cells is represented by dots.

The first control circuit 251 controls the first word line driver 221, the first gate circuit 231, and the first sense amplifier 241. For example, the first control circuit 251 may be disposed at a side of the first driver 221, the first gate circuit 231 and the first sense amplifier 241.

A second word line driver 222, a second gate circuit 232, a second sense amplifier 242, and a second control circuit 252 are used to read replacement data in a write/erase operation of the nonvolatile memory device.

The second word line driver 222 is connected to a word line WL to drive the word line. For example, the second word line driver 222 is disposed at one side (the right side in FIG. 1) of the replacement data memory cell array 21 and is connected to the word lines BL.

The second gate circuit 232 and the second sense amplifier 242 are configured to read replacement data outputted to the bit line. For example, the second gate circuit 232 and the second sense amplifier 242 are disposed at one side (the bottom side in FIG. 1) of the replacement data memory cell array 21 and are connected to the bit lines BL.

The second control circuit 252 controls the second word line driver 222, the second gate circuit 232, and the second sense amplifier 242. For example, the second control circuit 252 is disposed at the sides of the second driver 222, the second gate circuit 232 and the second sense amplifier 242.

For example, when a write/erase operation is performed on a specific bank of the nonvolatile memory device, replacement data about the specific bank are read.

In detail, it is assumed that a write/erase operation is performed on a specific bank of the nonvolatile memory device. In this case, the second control circuit 252 controls the second word line driver 222. The word line WL corresponding to the bank of the replacement data memory cell array 21 is driven by the second word line driver 222. Also, the second gate circuit 232 and the second sense amplifier 242 are controlled by the second control circuit 252.

Thus, the replacement data of the bank are outputted to a bit line BL by the replacement data memory cell MC connected to the word line WL. The replacement data outputted to the bit line BL are read through the second gate circuit 232 and the second sense amplifier 242.

As another example, when a write/erase operation is performed on another bank of the nonvolatile memory device, replacement data about the bank are read.

In detail, it is assumed that a write/erase operation is performed on another bank of the nonvolatile memory device. In this case, the first control circuit 251 controls the first word line driver 221. The word line WL corresponding to the bank of the replacement data memory cell array 21 is driven by the first word line driver 221. Also, the first gate circuit 231 and the first sense amplifier 241 are controlled by the first control circuit 251.

Thus, the replacement data of the bank are outputted to a bit line BL by the replacement data memory cell MC connected to the word line WL. The replacement data outputted to the bit line BL are read through the first gate circuit 231 and the first sense amplifier 241.

In the replacement data memory cell array 21, replacement data may be outputted discriminately. That is, replacement data may be outputted discriminately by changing the bit lines BL, which are connected to the replacement data memory cells MC, for every word line WL (bank). This is because the bit lines BL connected to the replacement data memory cells MC are different for every word line WL (bank).

Thus, replacement data in a read operation and a write/erase operation of the nonvolatile memory device may be simultaneously read by driving two word lines WL simultaneously. Herein, a read operation and a write/erase operation are prohibited from being simultaneously performed on the same bank. Thus, the word lines corresponding to the same bank are not simultaneously driven in a write/erase operation and a read operation.

Figure 4:
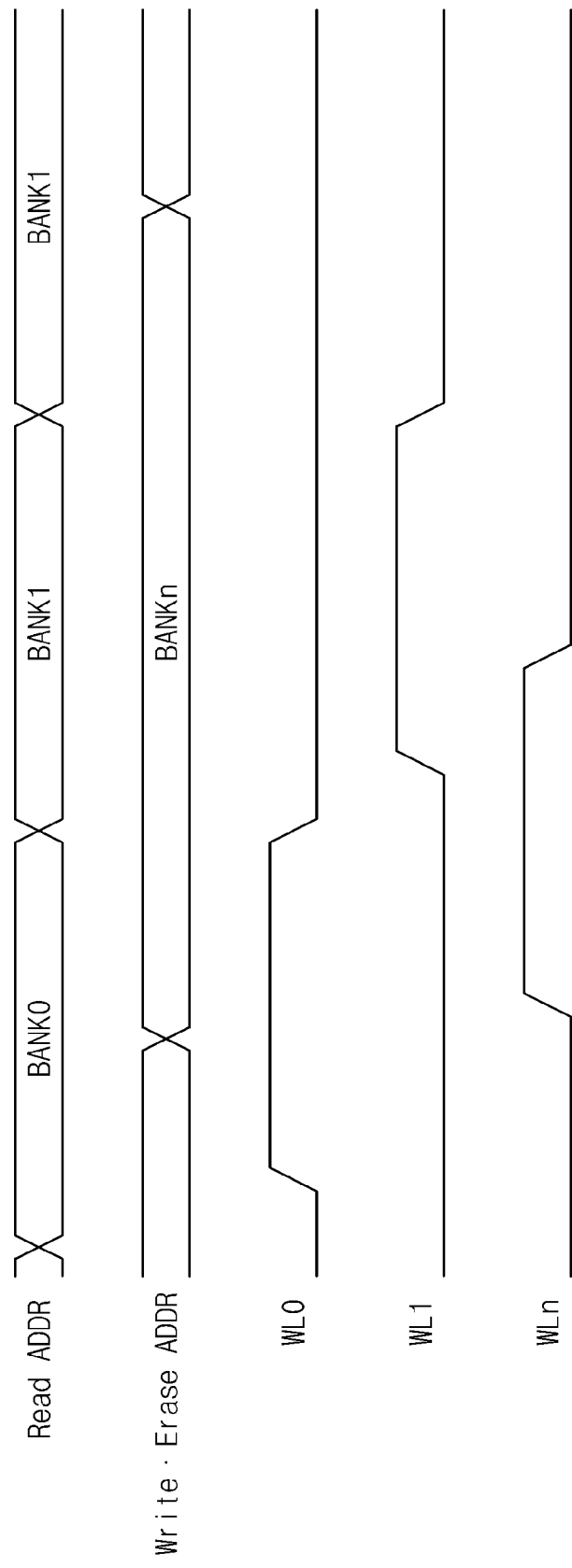
FIG. 4 is a timing diagram illustrating a write/erase operation and a read operation.

FIG. 4 is a timing diagram illustrating a write/erase operation and a read operation.

Referring to FIG. 4, a bank 0 of a nonvolatile memory device is selected at a read address. In this case, a word line WL0 of a replacement data memory cell array 21 corresponding to the selected bank 0 is driven. Accordingly, replacement data stored in replacement data memory cells MC connected to the word line WL0 are read.

Thereafter, a bank 1 of the nonvolatile memory device is selected at a read address. In this case, a word line WL1 of the replacement data memory cell array 21 corresponding to the selected bank 1 is driven. Accordingly, replacement data stored in replacement data memory cells MC connected to the word line WL1 are read.

During the above operations, a bank n of the nonvolatile memory device is selected at a read address. In this case, a word line WLn of the replacement data memory cell array 21 corresponding to the selected bank n is driven. Accordingly, replacement data stored in replacement data memory cells MC connected to the word line WLn are read.

As described above, although one replacement data memory cell array 21 is used, the replacement data storage circuit of the present general inventive concept can simultaneously read replacement data in a read operation and a write/erase operation of the nonvolatile memory device.

Also, in comparison with the typical replacement data storage circuit, the replacement data storage circuit of the present general inventive concept can store more replacement data in the replacement data memory cell array 21. Thus, the use of the replacement data storage circuit according to the present general inventive concept makes it possible to improve the yield and the defect relief rate of the nonvolatile memory device.

Also, the replacement data storage circuit of the present general inventive concept does not need a latch circuit because it reads replacement data in a read operation and a write/erase operation of the nonvolatile memory device. Therefore, the replacement data storage circuit of the present general inventive concept can store more replacement data in the replacement data memory cell array 21. Thus, the replacement data storage circuit of the present general inventive concept can improve the yield and the defect relief rate of the nonvolatile memory device.

Meanwhile, the replacement data storage circuit of the present general inventive concept may store the read replacement data in a latch circuit. However, the replacement data storage circuit of the present general inventive concept needs a latch circuit corresponding to replacement data of two banks. Thus, in comparison with the typical replacement data storage circuit, the replacement data storage circuit of the present general inventive concept is smaller in terms of the restriction of a latch circuit. Meanwhile, the replacement data storage circuit of the present general inventive concept needs two pairs of word line drivers. However, a layout increase due to this is smaller in comparison with the typical latch circuit.

Meanwhile, like the typical replacement data storage circuit, when a power supply voltage is applied, the replacement data storage circuit of the present general inventive concept may read some of the replacement data stored in the replacement data memory cell array 21, and latch the same in the internal circuit. Thus, the replacement data storage circuit of the present general inventive concept can also be easily applied to a scheme of replacing a defective block with a defect-free block.

Figure 7:
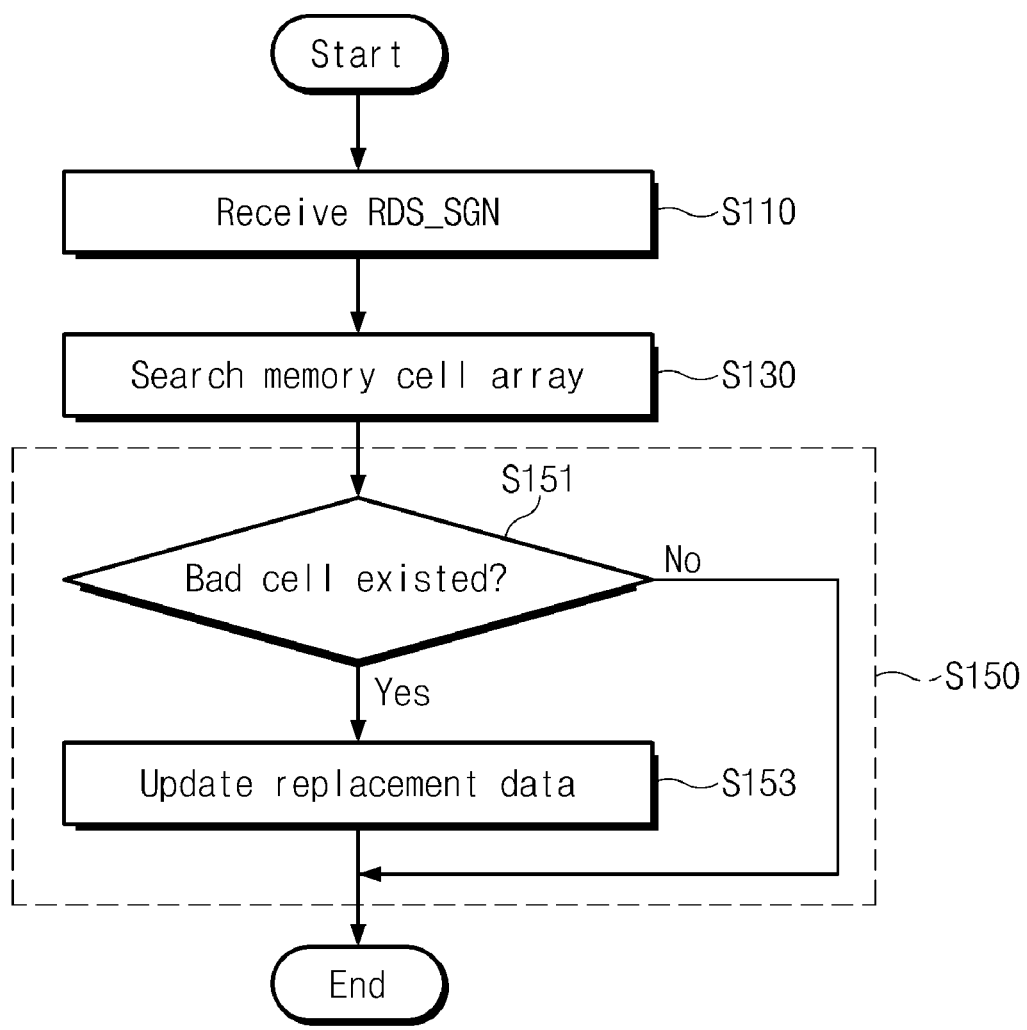
FIG. 7 is a flow chart illustrating a replacement data storage mode operation of a replacement data storage circuit according to an exemplary embodiment of the present general inventive concept.

FIG. 7 is a flow chart illustrating a replacement data storage mode operation of a replacement data storage circuit according to an exemplary embodiment of the present general inventive concept.

Referring to FIG. 7, in operation S110, a replacement data storage signal RDS_SGN is transferred to the nonvolatile memory device. As an example, the replacement data storage signal may be transferred from a host at the request of a user. As another example, the replacement data storage signal may be transferred when power is supplied to a memory system.

In operation S130, a search operation for a memory cell array is performed in response to the replacement data storage signal.

In operation S150, the replacement data of the memory cell array is stored in the replacement data storage circuit. Specifically, it is determined whether a defective memory cell is present in the memory cell array (operation S151). If a defective memory cell is present in the memory cell array, the replacement data of the corresponding memory cell is updated in the replacement data storage circuit (operation S153).

As described above, the address information of a defective memory cell of the nonvolatile memory device can be stored in the replacement data storage circuit.

The present general inventive concept is not limited to the above replacement data storage mode operation. For example, if each bank of the memory cell array includes a plurality of replaceable systems, the address information of the system including a defective memory cell may be stored in the replacement data storage circuit. As another example, the address information of a defect-free memory cell may also be stored in the replacement data storage circuit.

Figure 8:
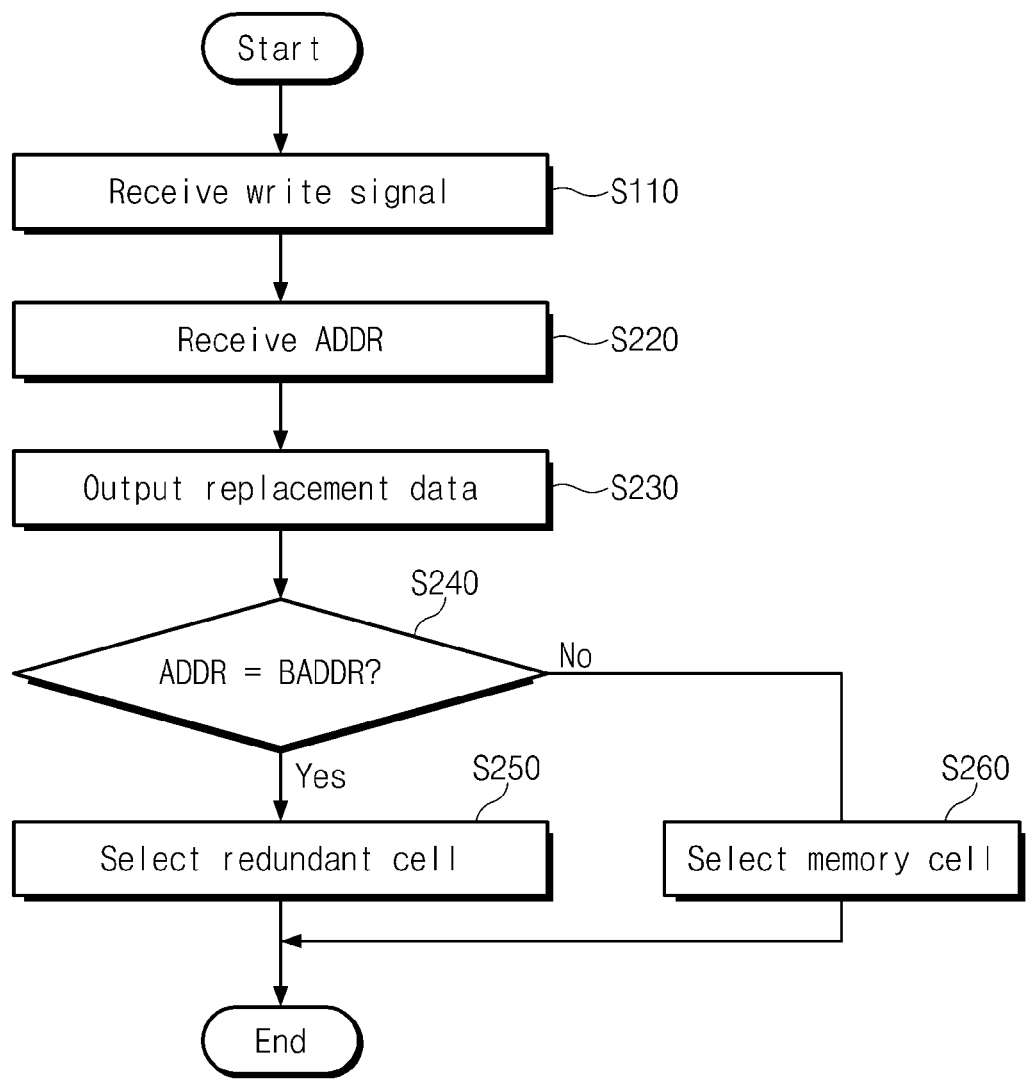
FIG. 8 is a flow chart illustrating an operation of a replacement data storage circuit in response to a write request according to an exemplary embodiment of the present general inventive concept.

FIG. 8 is a flow chart illustrating an operation of the replacement data storage circuit in response to a write request according to an exemplary embodiment of the present general inventive concept.

Referring to FIG. 8, in operation S210, a write signal is transferred to the nonvolatile memory device.

In operation S220, address (ADDR) information is transferred to the replacement data storage circuit in response to the write signal. That is, in order to acquire the replacement data of a memory cell to be written, the address information of the corresponding memory cell is transferred to the replacement data storage circuit.

In operation S230, the replacement data of the corresponding memory cell is outputted on the basis of the address information of the corresponding memory cell. That is, the replacement data storage circuit outputs the replacement data of the memory cell to be written, which are stored in the replacement data memory cells.

In operation S240, on the basis of the outputted replacement data, it is determined whether a replacement operation is necessary. That is, it is determined whether an address of a memory cell to be written is an address of a defective memory cell.

If a memory cell to be written is a defective memory cell, a redundant cell of a redundant cell array is selected (operation S250).

If a memory cell to be written is a defect-free memory cell, a memory cell of the memory cell array is selected (operation S260).

Figure 5:
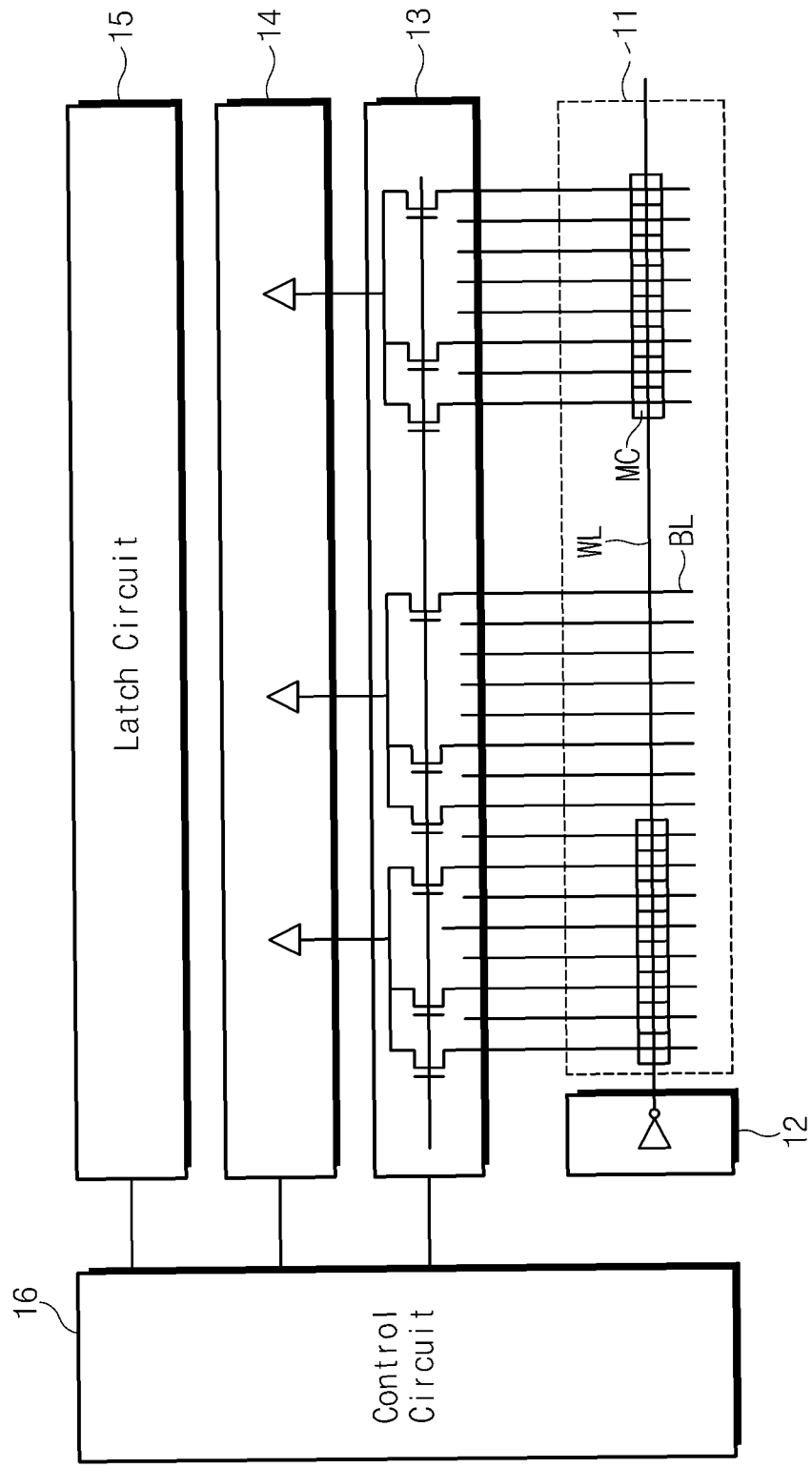
FIG. 5 is a diagram illustrating a typical replacement data storage circuit.
Figure 6:
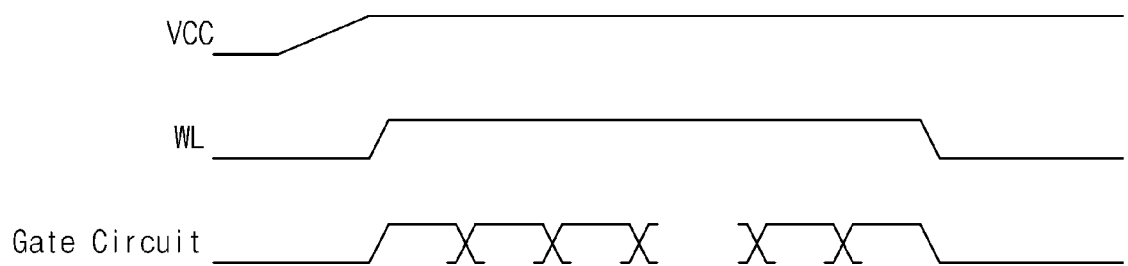
FIG. 6 is a timing diagram illustrating an operation of the typical replacement data storage circuit of FIG. 5.

As described above, the replacement data storage circuit of the present general inventive concept may provide replacement data at a write request from an external device. Thus, the replacement data storage circuit of the present general inventive concept does not need a latch circuit. On the other hand, the typical replacement data storage circuit of FIG. 5 is enabled to store replacement data in a latch circuit when a power supply voltage is applied thereto. Thus, the replacement data storage circuit of the present general inventive concept has no restriction on a latch circuit. Meanwhile, the present general inventive concept is not limited to the above operation of the replacement data storage circuit. For example, when a read request or an erase request is received from an external device, the replacement data storage circuit of the present general inventive concept may perform an operation similar to the above operation. As another example, when a read request and a write request are simultaneously received from an external device, the replacement data storage circuit of the present general inventive concept may perform the above operations simultaneously. This has been described in detail with reference to FIGS. 1 to 4, and thus a detailed description thereof will be omitted for conciseness.

Figure 9:
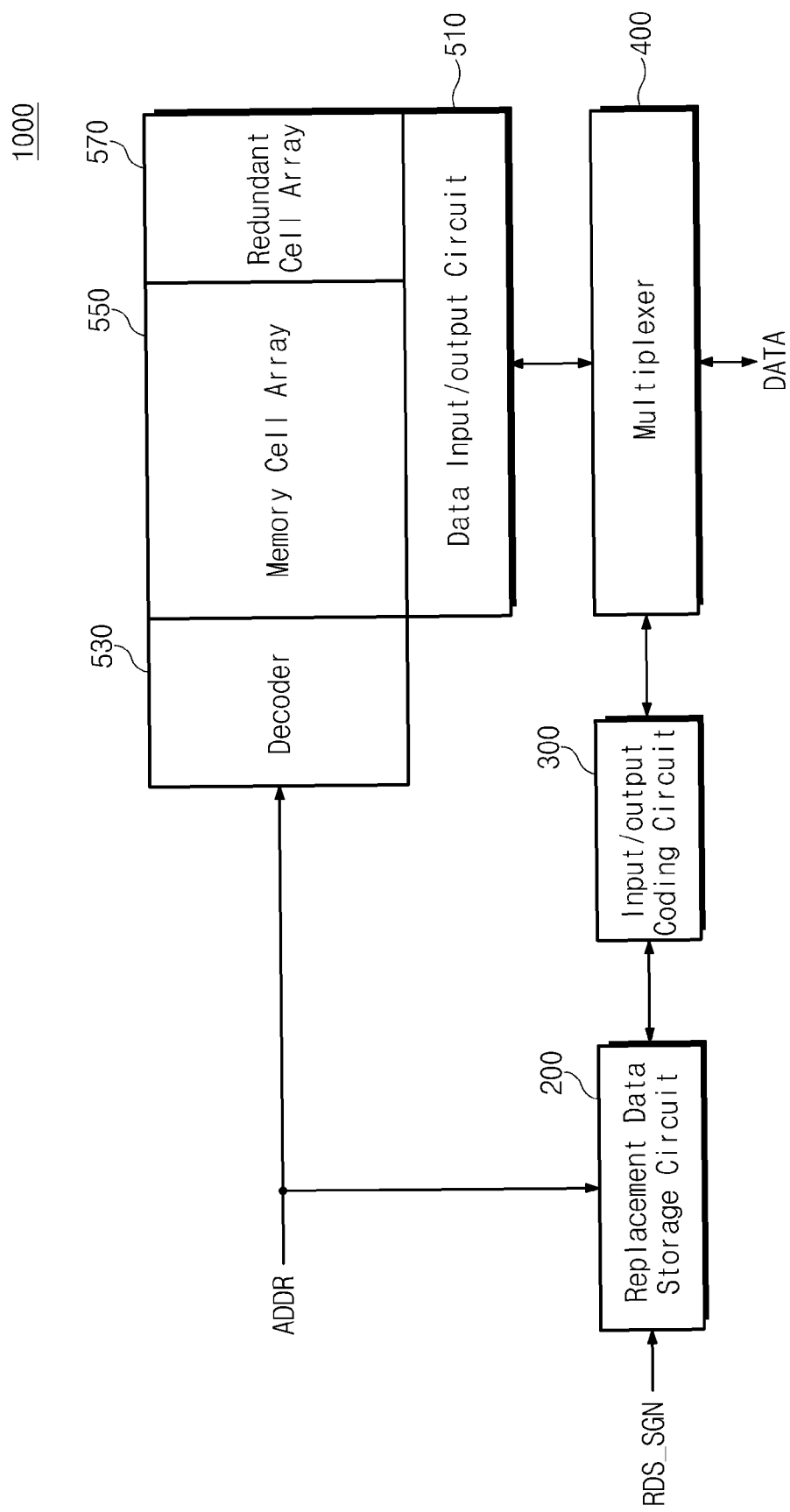
FIG. 9 is a block diagram of a nonvolatile memory device according to an exemplary embodiment of the present general inventive concept.

FIG. 9 is a block diagram of a nonvolatile memory device according to an exemplary embodiment of the present general inventive concept.

Referring to FIG. 9, a nonvolatile memory device 1000 includes a replacement data storage circuit 200, an input/output coding circuit 300, a multiplexer 400, a data input/output circuit 510, a decoder 530, a memory cell array 550, and a redundant cell array 570.

The replacement data storage circuit 200 stores replacement data of the memory cell array 550. The replacement data storage circuit 200 transfers the stored replacement data to the input/output coding circuit in the event of a read, write or erase request. For example, in the event of a write request for a bank of the memory cell array 550 received from an external device, the replacement data storage circuit 200 outputs replacement data of the bank. This has been described in detail with reference to FIGS. 1 to 8, and thus a detailed description thereof will be omitted for conciseness.

The input/output coding circuit 300 receives replacement data from the replacement data storage circuit 200. The input/output coding circuit 300 codes the received replacement data to output a redundant cell selection signal or a memory cell selection signal.

The multiplexer 400 receives a redundant cell selection signal or a memory cell selection signal from the input/output coding circuit 300. The multiplexer 400 transfers data (DATA) to the data input/output circuit 510 according to the control of a redundant cell selection signal or a memory cell selection signal. Also, the multiplexer 400 receives data from the data input/output circuit 510 according to the control of a redundant cell selection signal or a memory cell selection signal. As an example, in the event of a write request, the multiplexer 400 transfers data to the redundant cell array 570 in response to the control of a redundant cell selection signal. As another example, the multiplexer 400 transfers data to the memory cell array 550 in response to the control of a memory cell selection signal.

The data input/output circuit 510 receives data from the multiplexer 400. The data input/output circuit 510 stores the received data in the memory cell array 550 or the redundant cell array 570. Also, the data input/output circuit 510 receives data stored in the memory cell array 550 or the redundant cell array 570. The data input/output circuit 510 transfers the received data to the multiplexer 400.

The decoder 530 receives address (ADDR) information from the external device. For example, the decoder 530 receives and decodes a row address (Row ADDR). The decoder 530 selects a word line of the memory cell array 550 or the redundant cell array 570 on the basis of the decoded row address. For example, the decoder 530 receives and decodes a column address (Column ADDR). The decoder 530 selects a bit line selection signal (not illustrated) of the memory cell array 550 or the redundant cell array 570 on the basis of the decoded column address.

The memory cell array 550 includes a plurality of memory cells, a plurality of bit lines, and a plurality of word lines. The memory cell array 550 is divided into a plurality of banks. Each band is divided into a plurality of replaceable systems.

The redundant memory cell array 570 includes a plurality of redundant memory cells, a plurality of bit lines, and a plurality of word lines. The redundant memory cell array 570 is configured to repair a defective memory cell in the memory cell array 550 and store data to be stored in the defective memory cell.

Referring again to FIGS. 7 and 8 in view of FIG. 9, the replacement data storage circuit 200 may receive the replacement data storage signal RDS_SGN in operation S110 indicating that a replacement operation may be performed. The data input/output circuit 510, multiplexer 400, and input/output coding circuit 300 may analyze a memory cell in the memory cell array 550 to determine if the cell is a bad or faulty cell in operation S151. If it is determined that the cell is a bad cell, the input/output coding circuit 300 may update the replacement data in the replacement data storage circuit 200 in operation S153.

In FIGS. 8 and 9, the replacement data storage circuit 200 may receive the address ADDR at operation S220 and output replacement data at operation S230. The replacement data may include address information, requested data, or other control information. The input/output coding circuit 300 may receive the replacement data and determine whether the address ADDR corresponds to a previously-identified bad address BADADDR in operation S240. The multiplexer 400 and the data input/output circuit 510 may then select one of the memory cell array 550 and the redundant cell array 570 to output data in a read operation or receive data in a write operation, in one of operations S250 and S260.

Figure 10:
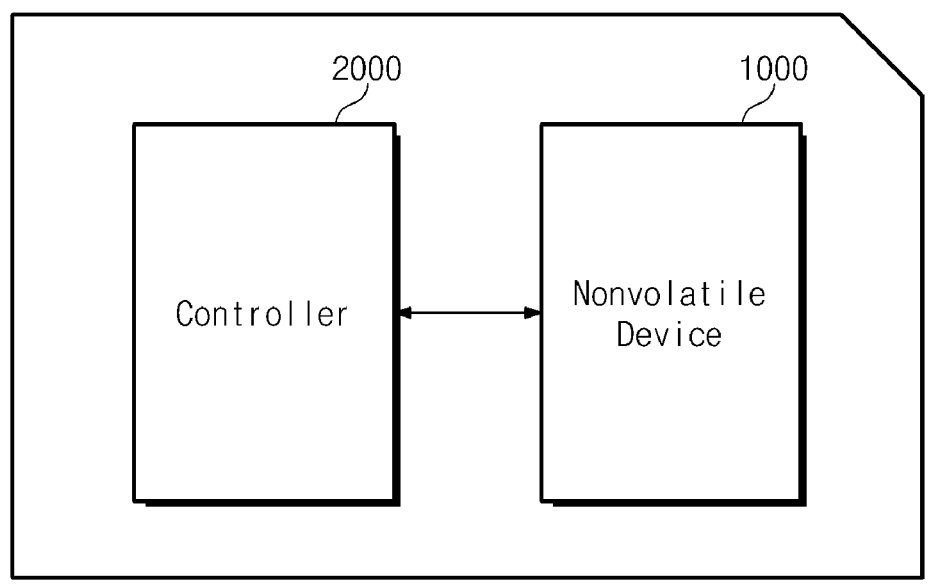
FIG. 10 is a block diagram of a memory system according to an exemplary embodiment of the present general inventive concept.

FIG. 10 is a block diagram of a memory system according to an exemplary embodiment of the present general inventive concept.

Referring to FIG. 10, a memory system 10 includes a controller 2000 and a nonvolatile memory device 1000.

The controller 2000 is connected to a host and the nonvolatile memory device 1000. The controller 2000 is configured to access the nonvolatile memory device 1000 in response a request from the host. For example, the controller 2000 is configured to control a read/write/erase operation of the nonvolatile memory device 1000. The controller 1000 is configured to provide an interface between the nonvolatile memory device 1000 and the host. The controller 1000 is configured to drive a firmware to control the nonvolatile memory device 1000.

The controller 2000 may include a random access memory (RAM), a processing unit, a host interface, and a memory interface. The RAM may be used as a working memory of the processing unit. The processing unit may control an overall operation of the controller 2000.

The host interface may include protocol for data exchange between the host and the controller 2000. For example, the controller 2000 may be configured to communicate with an external device (e.g., the host) through one of various interface protocols such as USB (Universal Serial Bus), MMC (Multimedia Card), PCI (Peripheral Component Interface), PCI-E (PCI-Express), ATA (Advanced Technology Attachment), Serial-ATA, Parallel-ATA, SCSI (Small Computer Small Interface), ESDI (Enhanced Small Disk Interface), and IDE (Integrated Drive Electronics). The memory interface may interface with the nonvolatile memory device 1000.

The nonvolatile memory device 1000 may include a memory cell array to store data, a read/write circuit to write/read data into/from the memory cell array, an address decoder to decode an address received from the external device and transferring the result to the read/write circuit, and a control logic unit to control an overall operation of the nonvolatile memory device 1000.

The memory system 10 may further include an error correction block. The error correction block may be configured to detect and correct an error in data read from the nonvolatile memory device 1000. As an example, the error correction block may be provided as a component of the controller 2000. As another example, the error correction block may be provided as a component of the nonvolatile memory device 1000.

The controller 2000 and the nonvolatile memory device 1000 may be integrated into one semiconductor device. As an example, the controller 2000 and the nonvolatile memory device 1000 may be integrated into one semiconductor device to constitute a memory card. For example, the controller 2000 and the nonvolatile memory device 1000 may be integrated into one semiconductor device to constitute a PC card (e.g., PCMCIA (Personal Computer Memory Card International Association)), a compact flash card (CF), a smart media card (e.g., SM and SMC), a memory stick, a multimedia card (e.g., MMC, RS-MMC and MMCmicro), a SD card (e.g., SD, miniSD, microSD and SDHC), or a universal flash storage (UFS).

As another example, the controller 2000 and the nonvolatile memory device 1000 may be integrated into one semiconductor device to constitute a solid state drive (SSD). As an example, the SSD may include a storage device configured to store data in a semiconductor memory. When the memory system 10 is used as an SSD, the operation speed of the host connected to the memory system 10 may increase remarkably.

As another example, the memory system 10 may be applicable to computers, portable computers, UMPCs (Ultra Mobile PCs), net-books, PDAs, web tablets, wireless phones, mobile phones, smart phones, digital cameras, digital audio recorders, digital audio players, digital picture recorders, digital picture players, digital video recorders, digital video players, devices capable of transmitting/receiving information in wireless environments, one of various electronic devices constituting a home network, one of various electronic devices constituting a computer network, one of various electronic devices constituting a telematics network, RFID devices, or one of various components constituting a computing system (e.g., an SSD or a memory card).

As another example, the nonvolatile memory device 1000 or the memory system 10 may be mounted in various types of packages. Examples of the packages of the nonvolatile memory device 1000 or the memory system 10 include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 11:
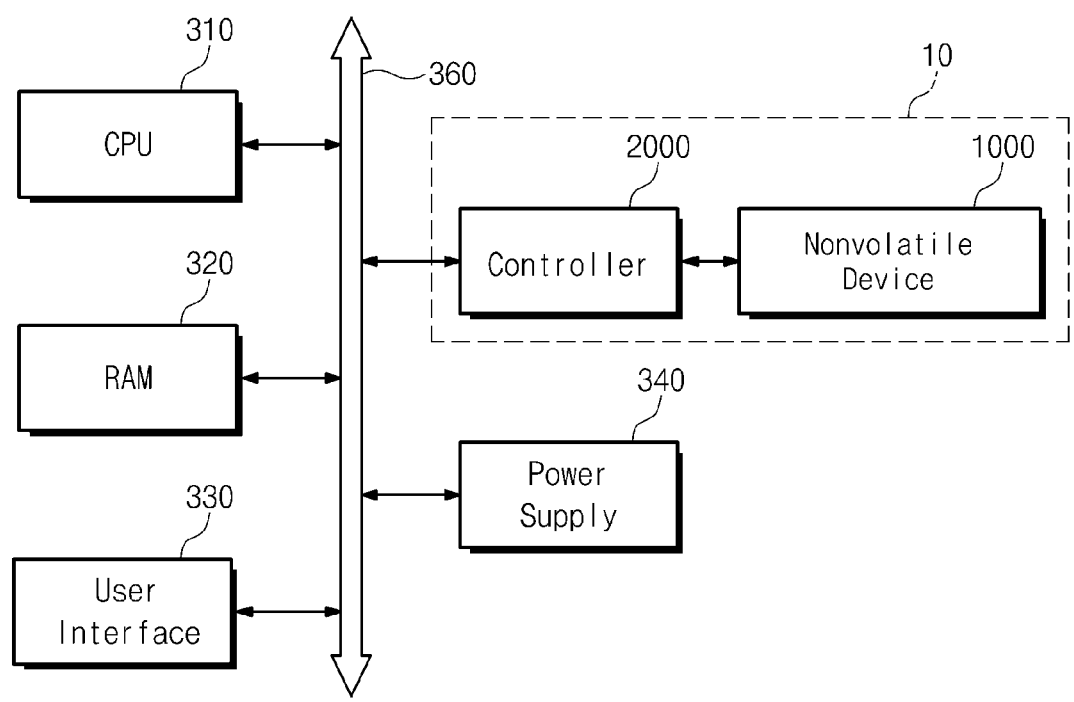
FIG. 11 is a block diagram of a computing system including the memory system of FIG. 10.

FIG. 11 is a block diagram of a computing system including the memory system of FIG. 10.

Referring to FIG. 11, a computing system according to an exemplary embodiment of the present general inventive concept includes a central processing unit (CPU) 310, a random access memory (RAM) 320, a user interface 330, a power supply unit 340, and a memory system 10.

The memory system 10 is electrically connected through a system bus 360 to the CPU 310, the RAM 320, the user interface 330, and the power supply unit 340. Data, which are provided through the user interface 330 or processed by the CPU 310, are stored in the memory system 10. The memory system 10 includes a controller 2000 and a nonvolatile memory device 1000. FIG. 11 illustrates that the nonvolatile memory device 1000 is connected through the controller 2000 to the system bus 360. However, as another example, the nonvolatile memory device 1000 may be connected directly to the system bus 360.

When the memory system 10 is provided as a solid state drive (SSD), the booting speed of the computing system may increase remarkably. Although not illustrated in FIG. 11, those skilled in the art will readily understand that the computing system may further include an application chipset and a camera image processor.

As described above, the replacement data storage circuit of the present general inventive concept can simultaneously read replacement data in a read operation and a write operation, thus reducing the driving time of the nonvolatile memory device. Also, in comparison with the typical replacement data storage circuit, the replacement data storage circuit of the present general inventive concept can store more replacement data, thus improving the defect relief rate of the nonvolatile memory device. Also, the replacement data storage circuit of the present general inventive concept can read replacement data in a read operation of the nonvolatile memory device. Thus, a latch circuit is unnecessary, and the area to implement the replacement data storage circuit is reduced.

The above-disclosed subject matter is to be considered illustrative and not restrictive, and the appended claims are intended to cover all such modifications, enhancements, and other embodiments, which fall within the true spirit and scope of the present general inventive concept. Thus, to the maximum extent allowed by law, the scope of the present general inventive concept is to be determined by the broadest permissible interpretation of the following claims and their equivalents, and shall not be restricted or limited by the foregoing detailed description.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A replacement data storage circuit to store at least one defective memory cell address, comprising:
    a plurality of word lines;
    a plurality of bit lines; and
    a plurality of replacement data memory cells connected to the word lines and the bit lines to store the at least one defective memory cell address,
    wherein each of the word lines and each of the bit lines is connected to only one memory cell.

2. The replacement data storage circuit of claim 1, wherein the replacement data memory cells are arranged diagonally at intersections of respective word lines and bit lines.

3. The replacement data storage circuit of claim 2, wherein the diagonal arrangement of the replacement data memory cells is repeated.

4. The replacement data storage circuit of claim 1, wherein a read operation and a write or erase operation are performed simultaneously by driving two different word lines, the replacement data storage circuit further comprising
   first and second word line drivers to drive the word lines, each word line driver connected to each word line,
   wherein the first word line driver is driven in the read operation of the nonvolatile memory device and the second word line driver is driven in a write or erase operation of the nonvolatile memory device.

5. A replacement data storage circuit, comprising:
   a plurality of memory cell arrays, each memory cell array comprising:
      a plurality of word lines; and
      a plurality of bit lines,
   wherein each memory cell of each separate array is connected to a separate word line and a separate bit line, and each bit line is connected to only one memory cell.

6. The replacement data storage circuit according to claim 5, wherein:
   a first memory cell of each memory cell array is connected to a same first word line of the plurality of word lines, and
   a respective subsequent memory cell of each memory cell array is connected to a same respective subsequent word line,
   wherein the same first word line corresponds to a bank of a nonvolatile memory device.

7. The replacement data storage circuit according to claim 5, further comprising at least one gate circuit to read data from and write data to each memory cell.

8. The replacement data storage circuit according to claim 7, further comprising at least first and second gate circuits to simultaneously read data from and write data to separate memory cells.

9. The replacement data storage circuit according to claim 7, further comprising:
   a word line driver to drive a word line to access corresponding memory cells;
   a sense amplifier to amplify an output of a bit line of an accessed memory cell; and
   a control circuit to control operation of the word line driver, the gate circuit, and the sense amplifier to read from and write to a memory cell.

10. The replacement data storage circuit according to claim 5, wherein the memory cells of each memory cell array are arranged diagonally with respect to each other memory cell in the memory cell array.

11. The replacement data storage circuit according to claim 10, wherein the memory cells of each memory cell array are arranged in only one diagonal line.

12. The replacement data storage circuit according to claim 5, wherein the replacement data storage circuit does not include a latch circuit to latch data read from or written to each memory cell.

13. The replacement data storage circuit according to claim 5, wherein each memory cell comprises a transistor having a gate connected to a word line of the plurality of word lines, a source connected to a common source line, and a drain connected to a bit line of the plurality of bit lines.

14. A non-volatile memory device, comprising:
   a memory unit including a memory cell array, a redundant cell array, and a data input/output unit to read data from and write data to the memory cell array and the redundant cell array, respectively; and
   a replacement data storage circuit to receive an address corresponding to at least one memory cell of the memory cell array and to output a control signal to direct the data input/output unit to read data from and write data to one of the memory cell array and the redundant cell array, respectively, the replacement data storage circuit comprising:
      a plurality of memory cell arrays, each memory cell array comprising:
         a plurality of word lines; and
         a plurality of bit lines,
      wherein each memory cell of each separate bank array is connected to a separate word line and a separate bit line, and
      each bit line is connected to only one memory cell.

15. The non-volatile memory device according to claim 14, further comprising:
   an input/output coding circuit to receive data output from the replacement data storage circuit corresponding to the received address; and
   a multiplexer to receive data output from the input/output coding circuit corresponding to the data output from the replacement data storage circuit, and to direct the data input/output unit to read data from and write data to one of the memory cell array and the redundant cell array, respectively, based on the data received from the input/output coding circuit.

16. The non-volatile memory device according to claim 14, wherein the memory unit further comprises a decoder to receive the address to access the at least one memory cell of the memory cell array.

17. A memory system, comprising:
   a non-volatile memory device, comprising:
      a memory unit including a memory cell array, a redundant cell array, and a data input/output unit to read data from and write data to the memory cell array and the redundant cell array, respectively; and
      a replacement data storage circuit to receive an address corresponding to at least one memory cell of the memory cell array and to output a control signal to direct the data input/output unit to read data from and write data to one of the memory cell array and the redundant cell array, respectively, the replacement data storage circuit comprising:
         a plurality of memory cell arrays, each memory cell array comprising:
            a plurality of word lines; and
            a plurality of bit lines,
         wherein each memory cell of each separate array is connected to a separate word line and a separate bit line, and each bit line is connected to only one memory cell; and
   a controller to control operation of the non-volatile memory device.

18. A computing device, comprising:
   a memory system including a non-volatile memory device, the non-volatile memory device comprising:
      a memory unit, including a memory cell array, a redundant cell array; and a data input/output unit to read data from and write data to the memory cell array and the redundant cell array, respectively; and
      a replacement data storage circuit to receive an address corresponding to at least one memory cell of the memory cell array and to output a control signal to direct the data input/output unit to read data from and write data to one of the memory cell array and the redundant cell array, respectively, the replacement data storage circuit comprising:
         a plurality of memory cell arrays, each memory cell array comprising:
            a plurality of word lines; and a plurality of bit lines,
wherein each memory cell of each separate array is connected to a separate word line and a separate bit line, and each bit line is connected to only one memory cell; and
a controller to control operation of the non-volatile memory device;
a RAM to store data including data from the memory system;
a user interface to initiate operations to access at least one of the memory system and the RAM;
a CPU to control operation of the computing device including access to the memory system and the RAM and the operation of the user interface; and
a power supply.

* * * * *